(12) United States Patent
Yamanaka et al.

(10) Patent No.: US 9,059,569 B2
(45) Date of Patent: Jun. 16, 2015

(54) NITRIDE SEMICONDUCTOR LIGHT-EMITTING SYSTEM

(71) Applicant: PANASONIC CORPORATION, Osaka (JP)

(72) Inventors: Kazuhiko Yamanaka, Osaka (JP); Shinji Yoshida, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/273,496

(22) Filed: May 8, 2014

(65) Prior Publication Data
US 2014/0241388 A1 Aug. 28, 2014

Related U.S. Application Data

(63) Continuation of application No. PCT/JP2012/002954, filed on May 1, 2012.

(30) Foreign Application Priority Data

Nov. 30, 2011 (JP) .................................. 2011-261405

(51) Int. Cl.
H01L 33/62 (2010.01)
H01L 23/12 (2006.01)
(Continued)

(52) U.S. Cl.
CPC . *H01S 5/30* (2013.01); *H01L 33/62* (2013.01); *H01L 33/486* (2013.01);
(Continued)

(58) Field of Classification Search
CPC ..... H01L 33/483; H01L 33/486; H01L 33/60; H01L 33/62; H01L 33/045; H01S 5/02212; H01S 5/02224

USPC ................. 257/100, 704, E33.057, E33.058, 257/E23.184
See application file for complete search history.

(56) References Cited

U.S. PATENT DOCUMENTS 5,296,724 A * 3/1994 Ogata et al. ..................... 257/98
6,541,800 B2 * 4/2003 Barnett et al. ................... 257/98
(Continued)

FOREIGN PATENT DOCUMENTS

JP 59-074738 U 5/1984
JP 62-073648 A 4/1987
(Continued)

OTHER PUBLICATIONS

International Search Report issued in International Application No. PCT/JP2012/002954 with Date of mailing Jun. 19, 2012, with English Translation.
(Continued)

*Primary Examiner* — Marvin Payen
*Assistant Examiner* — Jeremy Joy
(74) *Attorney, Agent, or Firm* — McDermott Will & Emery LLP

(57) ABSTRACT

A nitride semiconductor light-emitting system includes a nitride semiconductor light-emitting device, a base mount holding the nitride semiconductor light-emitting device, having an opening, and containing first metal as a main component, a cap adhered to the base mount, and a lead pin penetrating the opening. The lead pin is fixed to an inner wall of the opening with an insulating member and a buffer member interposed therebetween, the buffer member and the insulating member being stacked on the inner wall in this order. The insulating member contains silicon oxide as a component. The buffer member is made of second metal having a smaller standard oxidation-reduction potential than the first metal, or an alloy containing the second metal.

15 Claims, 18 Drawing Sheets

(51) Int. Cl.

| | | |
|---|---|---|
| *H01S 5/022* | (2006.01) | |
| *H01S 5/30* | (2006.01) | |
| *H01L 33/48* | (2010.01) | |
| *H01L 23/045* | (2006.01) | |
| *H01S 5/22* | (2006.01) | |
| H01S 5/00 | (2006.01) | |
| H01S 5/024 | (2006.01) | |
| H01S 5/323 | (2006.01) | |
| H01S 5/40 | (2006.01) | |
| H01S 5/02 | (2006.01) | |

(52) U.S. Cl.
CPC .............. *H01L 23/045* (2013.01); *H01S 5/005* (2013.01); *H01S 5/02212* (2013.01); *H01S 5/02276* (2013.01); *H01S 5/02296* (2013.01); *H01S 5/02469* (2013.01); *H01S 5/02492* (2013.01); *H01S 5/32341* (2013.01); *H01S 5/4018* (2013.01); *H01S 5/2224* (2013.01); *H01S 5/024* (2013.01); *H01L 2224/48091* (2013.01); *H01S 5/02* (2013.01)

(56) References Cited

U.S. PATENT DOCUMENTS

| | | | |
|---|---|---|---|
| 2002/0018500 A1* | 2/2002 | Aikiyo et al. ................... | 372/36 |
| 2005/0072985 A1* | 4/2005 | Yamamoto ...................... | 257/99 |
| 2005/0121684 A1 | 6/2005 | Aruga et al. | |
| 2005/0242359 A1* | 11/2005 | Yoshida et al. ................. | 257/99 |
| 2007/0147449 A1* | 6/2007 | Bessho et al. ................... | 372/36 |
| 2009/0140416 A1* | 6/2009 | Ishida et al. ................... | 257/704 |
| 2010/0032705 A1* | 2/2010 | Shin et al. ....................... | 257/99 |
| 2010/0074288 A1 | 3/2010 | Yamamoto | |
| 2010/0237379 A1* | 9/2010 | Kuo et al. ....................... | 257/99 |

FOREIGN PATENT DOCUMENTS

| | | | | |
|---|---|---|---|---|
| JP | 62073648 | A | * | 4/1987 |
| JP | 62073649 | A | * | 4/1987 |
| JP | S62-73648 | A | | 4/1987 |
| JP | S63-79351 | A | | 4/1988 |
| JP | 64-064248 | A | | 3/1989 |
| JP | 1-274459 | A | | 11/1989 |
| JP | 10-051077 | A | | 2/1998 |
| JP | 2001-318279 | A | | 11/2001 |
| JP | 2001-358398 | A | | 12/2001 |
| JP | 2002084027 | A | * | 3/2002 |
| JP | 2003-318477 | A | | 11/2003 |
| JP | 2004-006450 | A | | 1/2004 |
| JP | 2004-289010 | A | | 10/2004 |
| JP | 2005-277328 | A | | 10/2005 |
| JP | 2005277328 | A | * | 10/2005 |
| JP | 2006-196506 | A | | 7/2006 |
| JP | 2009-135235 | A | | 6/2009 |
| JP | 2009-152520 | A | | 7/2009 |
| JP | 2009152520 | A | * | 7/2009 |
| JP | 55-12376 | B2 | | 6/2014 |

OTHER PUBLICATIONS

Chinese Office Action dated Sep. 11, 2014 issued in Chinese Patent Application No. 201280052274.4 (English translation).

* cited by examiner

FIG.5

| MATERIAL (PURE METAL) | THERMAL CONDUCTIVITY (W/mK) | THERMAL EXPANSION COEFFICIENT (×10⁻⁶/K) | STANDARD OXIDATION-REDUCTION POTENTIAL(V) | CORROSIVITY (FORMATION OF PASSIVATION FILM/ OXIDATION FILM) |
|---|---|---|---|---|
| GOLD (Au) | 320 | 14 | 1.52 | |
| PLATINUM (Pt) | 72 | 9 | 1.19 | |
| SILVER (Ag) | 420 | 19 | 0.80 | |
| COPPER (Cu) | 390 | 17 | 0.34 | |
| NICKEL (Ni) | 91 | 13 | −0.26 | |
| COBALT (Co) | 100 | 13 | −0.28 | ○ |
| IRON (Fe) | 80 | 12 | −0.44 | ○ |
| CHROME (Cr) | 94 | 5 | −0.74 | ○ |
| TITANIUM (Ti) | 22 | 9 | −1.63 | ◉ |
| ALUMINUM (Al) | 240 | 24 | −1.68 | ◉ |
| MAGNESIUM (Mg) | 160 | 25 | −2.36 | ○ |
| MOLYBDENUM (Mo) | 140 | 5 | − | ○ |
| TUNGSTEN (W) | 170 | 5 | − | ○ |

○: STABLE OXIDE FILM IS FORMED
◉: PASSIVATION FILM IS FORMED

FIG.6A

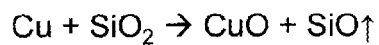
$Cu + SiO_2 \rightarrow CuO + SiO\uparrow$

FIG.6B

$SiO + R \rightarrow SiO\text{-}R \quad (R\text{:ORGANICS})$

FIG.6C $$\overset{LIGHT}{SiO(\text{-}R) + kO_2 \rightarrow SiO_2 + (mCO_2 + nH_2O)}$$
(k, m, AND n ARE INTEGRAL MULTIPLES OF 1/2)

FIG.7A

|  | MATERIALS | | THERMAL RESISTANCE |
|---|---|---|---|
|  | BASE | POST |  |
| FIRST EXAMPLE | STEEL | OXYGEN-FREE COPPER | 10.1 K/W |
| SECOND EXAMPLE | OXYGEN-FREE COPPER | OXYGEN-FREE COPPER | 8.1 K/W |
| FIRST EMBODIMENT | OXYGEN-FREE COPPER | OXYGEN-FREE COPPER | 8.0 K/W |

| COMPONENT | MATERIALS | THERMAL CONDUCTIVITY (W/mK) | THERMAL EXPANSION COEFFICIENT (x10⁻⁶/K) | REMARKS |
|---|---|---|---|---|
| BASE | COPPER (OXYGEN-FREE COPPER) | 390 | 17 | |
| BUFFER MEMBER | ALUMINUM ALLOY | 209 | 23 | A6063 (JIS) |
| | MAGNESIUM ALLOY | 100 | 26 | AZ31 (JIS) |
| | STEEL | 70 | 12 | |
| | STAINLESS STEEL | 26 | 10 | SUS430 (JIS) |
| | NICKEL | 91 | 13 | |
| | TITANIUM (TI) | 22 | 9 | |
| INSULATING MEMBER | SOFT GLASS | 0.7 | 9 | |
| LEAD PIN | Fe-Ni ALLOY (42 ALLOY) | 15 | 5 | |
| | KOVAR (Fe-Ni-Co ALLOY) | 17 | 5 | |

FIG.7D

| COMPONENT | MATERIALS | THERMAL CONDUCTIVITY (W/mK) | THERMAL EXPANSION COEFFICIENT (x10⁻⁶/K) | REMARKS |
|---|---|---|---|---|
| BASE | COPPER (OXYGEN-FREE COPPER) | 390 | 17 | |
| BUFFER MEMBER | COPPER MOLYBDENUM | 222 | 8 | 60Mo-40Cu |
| | COPPER TUNGSTEN | 200 | 8 | 80W-20Cu |
| | TITANIUM (TI) | 22 | 9 | |
| INSULATING MEMBER | HARD GLASS | 1 | 5 | |
| LEAD PIN | Fe-Ni ALLOY (42 ALLOY) | 15 | 5 | |
| | KOVAR (Fe-Ni-Co ALLOY) | 17 | 5 | |

FIG.7E

| COMPONENT | MATERIALS | THERMAL CONDUCTIVITY (W/mK) | THERMAL EXPANSION COEFFICIENT (x10⁻⁶/K) |
|---|---|---|---|
| BASE | COPPER (OXYGEN-FREE COPPER) | 390 | 17 |
| BUFFER MEMBER | Fe-Ni ALLOY (42 ALLOY) | 15 | 5 |
| | KOVAR (Fe-Ni-Co ALLOY) | 17 | 5 |
| | CHROME (Cr) | 94 | 5 |
| | MOLYBDENUM | 140 | 5 |
| | TUNGSTEN | 170 | 5 |
| INSULATING MEMBER | HARD GLASS | 1 | 5 |
| LEAD PIN | Fe-Ni ALLOY (42 ALLOY) | 15 | 5 |
| | KOVAR (Fe-Ni-Co ALLOY) | 17 | 5 |

NITRIDE SEMICONDUCTOR LIGHT-EMITTING SYSTEM

CROSS-REFERENCE TO RELATED APPLICATIONS

This is a continuation of International Application No. PCT/JP2012/002954 filed on May 1, 2012, which claims priority to Japanese Patent Application No. 2011-261405 filed on Nov. 30, 2011. The entire disclosures of these applications are incorporated by reference herein.

BACKGROUND

The present disclosure relates to semiconductor light-emitting systems used for displays such as projectors and laser processors. More particularly, the present disclosure relates to nitride semiconductor light-emitting systems including nitride semiconductor light-emitting devices, which emit light with high light intensity and a wavelength within the range from ultraviolet light to blue light.

Nitride semiconductor light-emitting systems including nitride semiconductor light-emitting devices such as semiconductor lasers are being actively developed as light sources of image display devices such as laser displays and projectors, as well as light sources of industrial processors such as laser scribing apparatuses and annealing apparatuses for thin films. The light emitted from the nitride semiconductor light-emitting devices has a wavelength ranging from ultraviolet light and blue light, and sometimes an extremely great optical output over 1 watt. Innovative approaches are thus needed for packages mounting the nitride semiconductor light-emitting devices.

In view of the background, for example, as described in Japanese Unexamined Patent Publication No. 2009-135235, conventional nitride semiconductor light-emitting systems have employed package configurations similar to those in the semiconductor light-emitting systems mounting semiconductor lasers emitting light with a wavelength within the range from infrared light to red light. Specifically, in a semiconductor light-emitting system, a semiconductor light-emitting device is mounted on a metal base mount, and then enclosed by a cap member with a light-transmitting window. This configuration seals the semiconductor light-emitting device from the outside to radiate heat from the semiconductor light-emitting device, and to extract light from the semiconductor light-emitting device to the outside. First, such a conventional semiconductor light-emitting system will be described below with reference to FIG. 11.

A conventional semiconductor light-emitting system 1000 includes a semiconductor laser device 1030, a sub-mount 1010, a package 1040, and a cap member 1100. The package 1040 includes a stem 1001 made of an iron-based material, a block 1002 of oxygen-free copper attached onto the stem 1001, lead pins 1004 and 1005 respectively attached to through-holes 1001a and 1001b of the stem 1001 via insulating rings 1020 made of glass, and a lead pin 1003 directly attached to the stem 1001. The semiconductor laser device 1030 is mounted in the block 1002 via the sub-mount 1010, and is electrically connected to the lead pins 1004 and 1005 by two wires 1008 and 1009. The cap member 1100 includes a metal cap 1103 made of kovar, and a light-transmitting window 1104 of glass fixed by low-melting glasses 1105. The metal cap 1103 includes cylindrical side walls 1101, a top surface 1102 closing one ends of the side walls 1101 and having an emitting hole 1102a extracting laser light from the semiconductor laser device 1030 to the outside. The metal cap 1103 further includes flanges 1103a disposed at the other ends of the sidewalls 1101 to adhere the cap member 1100 to the upper surface of the stem 1001, on which the semiconductor laser device 1030 is disposed, by resistance welding. At the emitting hole 1102a, the light-transmitting window 1104 is attached to the top surface 1102 to close the opening.

On the other hand, different from this package configuration, Japanese Unexamined Patent Publication No. 2001-358398 suggests a package configuration with high heat radiation and airtightness. A conventional semiconductor light-emitting system 2000 will be described below with reference to FIG. 12. In the semiconductor light-emitting system 2000, welding-aids 2015 are fixedly formed in a stem 2001 of a package 2040, which fixes a semiconductor laser device 2030, at the portion welded and joined to a cap 2100 by silver brazing. The cap 2100 is welded and joined to the welding-aids 2015. Since the stem 2001 is then jointed to the cap 2100 via the welding-aids 2015, the material of the stem 2001 can be selected regardless of the weldability between the cap 2100 and the stem 2001. As a result, heat generated from the semiconductor laser device 2030 is efficiently radiated outside via a sub-mount 2010, a device fixing block 2002, and the stem 2001, thereby improving the radiation of the heat generated in the semiconductor laser device 2030.

SUMMARY

The present inventors found that the nitride semiconductor light-emitting systems using the conventional packages having the above-described configurations have the following problems. First, in the invention shown in FIG. 11, the stem attached to the cap member is made of the Fe-based material, thereby providing insufficient thermal conductivity. The optical output of the semiconductor light-emitting device is difficult to increase.

On the other hand, in the invention shown in FIG. 12, the stem can be made of a high thermal conductivity material. However, the present inventors concluded from their study that the characteristics of the nitride semiconductor light-emitting device may deteriorate depending on the material of the stem.

The present disclosure addresses the problems. It is the first objective of the present disclosure to provide a nitride semiconductor light-emitting system packaging a nitride semiconductor light-emitting device, while reducing deterioration in the characteristics of the nitride semiconductor light-emitting device. It is the second objective to provide a semiconductor light-emitting system having less deteriorated characteristics and improved heat radiation by efficiently radiating Joule heat generated in the nitride semiconductor light-emitting device outside the package.

A nitride semiconductor light-emitting system according to the present disclosure includes a nitride semiconductor light-emitting device; a base mount holding the nitride semiconductor light-emitting device, having an opening, and containing first metal as a main component; a cap adhered to the base mount; and a lead pin penetrating the opening. The lead pin is fixed to an inner wall of the opening with an insulating member and a buffer member interposed therebetween, the buffer member and the insulating member being stacked on the inner wall in this order. The insulating member contains silicon oxide as a component. The buffer member is made of second metal having a smaller standard oxidation-reduction potential than the first metal, or an alloy containing the second metal.

With this configuration, the base mount is separated from the insulating member containing silicon oxide as the component by the buffer member, thereby reducing deterioration in the characteristics of the nitride semiconductor light-emitting device.

In the nitride semiconductor light-emitting system according to the present disclosure, the base mount preferably contains Cu as a main component.

This configuration efficiently radiates the Joule heat generated from the nitride semiconductor light-emitting device outside the package, and reduces deterioration in the characteristics of the nitride semiconductor light-emitting device.

In the nitride semiconductor light-emitting system according to the present disclosure, the buffer member is preferably made of any one metal of Fe, Ni, Co, Cr, Ti, Al, Mg, Mo, or W, or an alloy containing any of the metal.

This configuration efficiently radiates the Joule heat generated from the nitride semiconductor light-emitting device outside the package, and reduces deterioration in the characteristics of the nitride semiconductor light-emitting device.

In the nitride semiconductor light-emitting system according to the present disclosure, the buffer member is preferably made of Fe or an Fe alloy.

This configuration effectively reduces deterioration in the characteristics of the nitride semiconductor light-emitting device.

In the nitride semiconductor light-emitting system according to the present disclosure, a thermal expansion coefficient of the buffer member is preferably equal to or greater than a thermal expansion coefficient of the insulating member.

In the nitride semiconductor light-emitting system according to the present disclosure, a thermal expansion coefficient of the lead pin is preferably equal to or smaller than the thermal expansion coefficient of the insulating member.

In the nitride semiconductor light-emitting system according to the present disclosure, a thermal expansion coefficient of the base mount is preferably equal to or greater than the thermal expansion coefficient of the buffer member.

In the nitride semiconductor light-emitting system according to the present disclosure, an atmosphere enclosed by the base mount and the cap preferably contains oxygen.

In the nitride semiconductor light-emitting system according to the present disclosure, light emitted from the nitride semiconductor light-emitting device preferably has a density of 100 MW/cm$^2$ or greater.

With this configuration, the nitride semiconductor light-emitting system has an optical output of 1 watt or greater, and reduces deterioration in the characteristics of the nitride semiconductor light-emitting device during long time drive.

In the nitride semiconductor light-emitting system according to the present disclosure, the base mount preferably includes a base having the opening, and a post connected to the base. The base preferably has a principal surface facing the nitride semiconductor light-emitting device, and a fixed surface opposite to the principal surface. The post preferably has a device fixing surface perpendicular to the principal surface of the base. Each of the base and the post contains Cu as a main component.

This configuration efficiently radiates the Joule heat generated from the nitride semiconductor light-emitting device outside the package.

In the nitride semiconductor light-emitting system according to the present disclosure, a surface of the buffer member close to the fixed surface is preferably located inside the opening.

With this configuration, since the buffer member does not protrude beyond the opening, the adhesiveness between the fixed surface of the base and a fixture improves, thereby improving the heat radiation of the nitride semiconductor light-emitting system.

The nitride semiconductor light-emitting system according to the present disclosure preferably further includes a fixture holding the base. The fixture covers part of the opening.

This configuration improves the heat radiation of the nitride semiconductor light-emitting system.

The nitride semiconductor light-emitting system according to the present disclosure preferably further includes a plurality of lead pins. Each of the plurality of lead pins is preferably provided with the opening and the buffer member.

The nitride semiconductor light-emitting system according to the present disclosure preferably includes a plurality of lead pins. The opening and the buffer member are preferably shared by the plurality of lead pins. The buffer member preferably has a plurality of openings penetrated by the plurality of lead pins.

According to the nitride semiconductor light-emitting system of the present disclosure, in the package in which the lead pin is fixed to the base mount with the insulating film interposed therebetween, the base mount is separated from the insulating member containing silicon oxide as the component by the buffer member. This reduces deterioration in the characteristics of the nitride semiconductor light-emitting device. Furthermore, the base mount can be made of a high thermal conductivity material, thereby efficiently radiating the heat generated in the nitride semiconductor light-emitting device outside the package.

BRIEF DESCRIPTION OF THE DRAWINGS

FIG. 5 illustrates the characteristics of the materials used in the nitride semiconductor light-emitting system.

FIG. 6A illustrates a mechanism of possible gas generation in the first embodiment.

FIG. 6B illustrates a mechanism of possible gas generation in the first embodiment.

FIG. 6C illustrates a mechanism of possible gas generation in the first embodiment.

FIG. 7A illustrates a result of comparison between the nitride semiconductor light-emitting system according to the first embodiment and comparison examples.

FIG. 7D illustrates example materials of the components of the nitride semiconductor light-emitting system according to the first embodiment.

FIG. 7E illustrates example materials of the components of the nitride semiconductor light-emitting system according to the first embodiment.

DETAILED DESCRIPTION

Preferred embodiments of the present disclosure will be described hereinafter with reference to the drawings.

First Embodiment

Figure 1A:
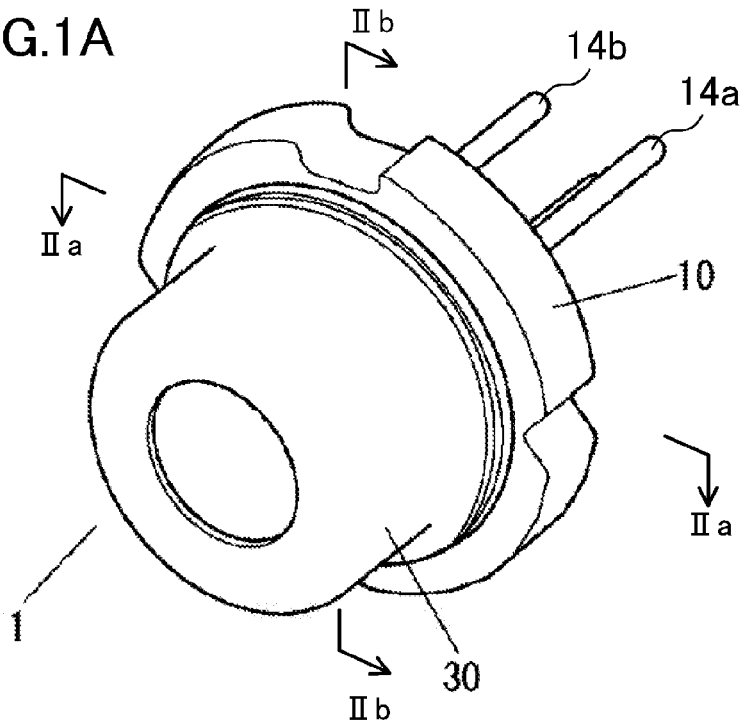
FIG. 1A is a perspective view of a nitride semiconductor light-emitting system according to a first embodiment.
Figure 1B:
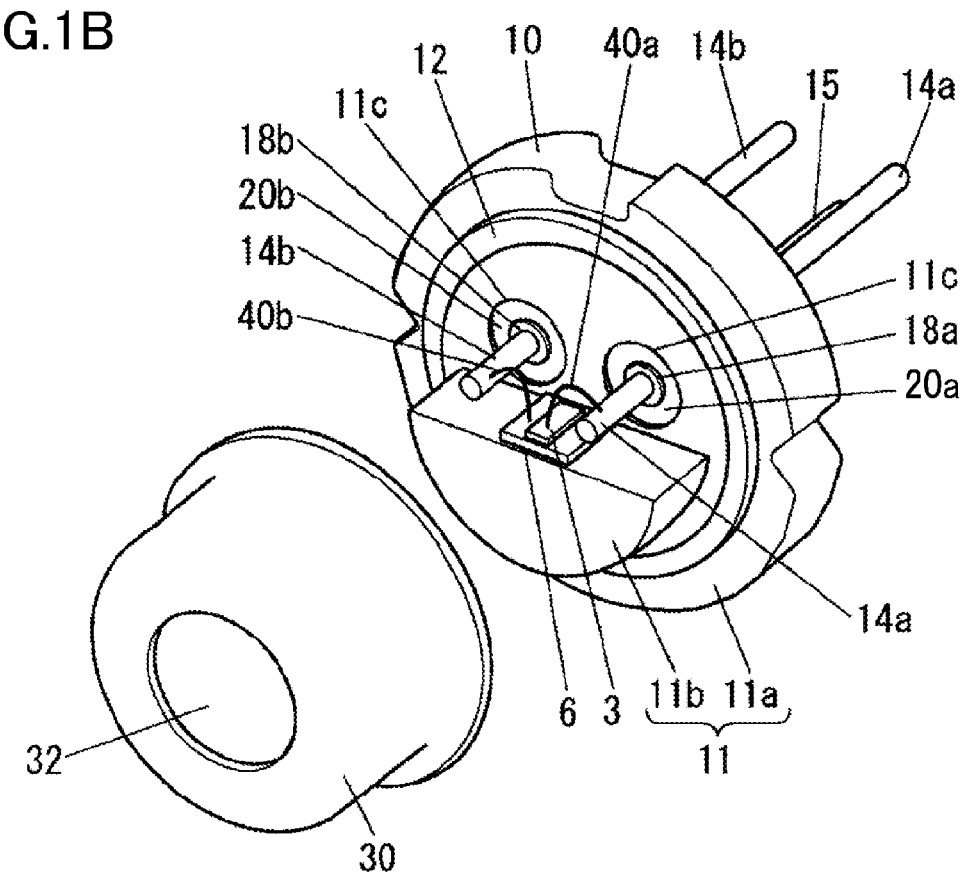
FIG. 1B is a exploded perspective view of the nitride semiconductor light-emitting system according to the first embodiment.
Figure 2A:
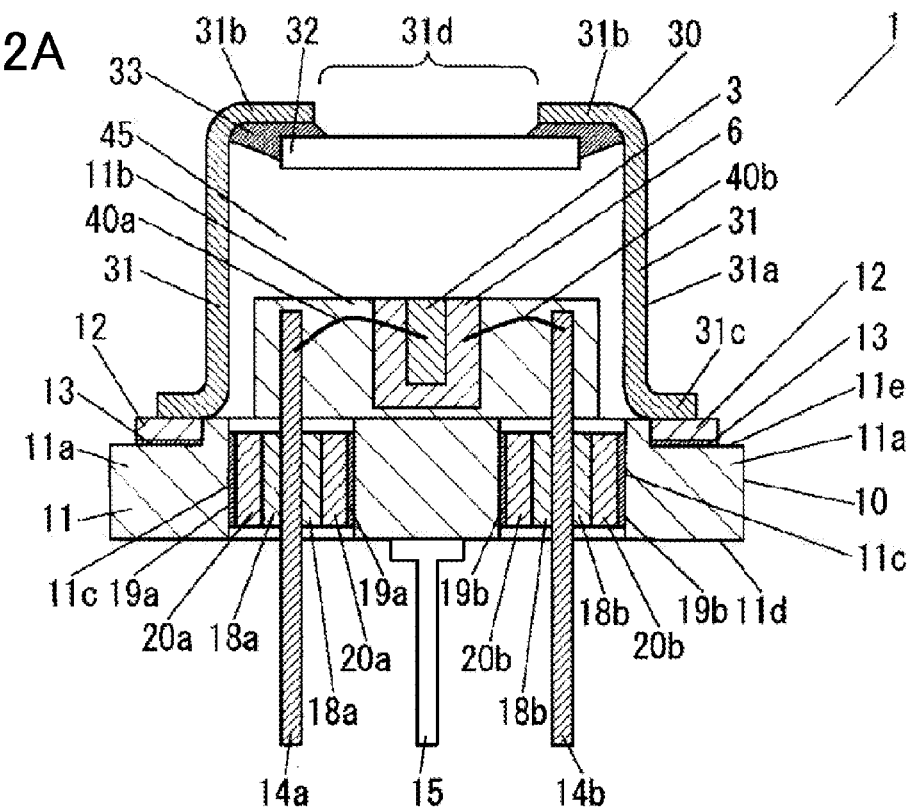
FIG. 2A is a cross-sectional view taken along the line IIa-IIa of the nitride semiconductor light-emitting system in FIG. 1A.
Figure 2B:
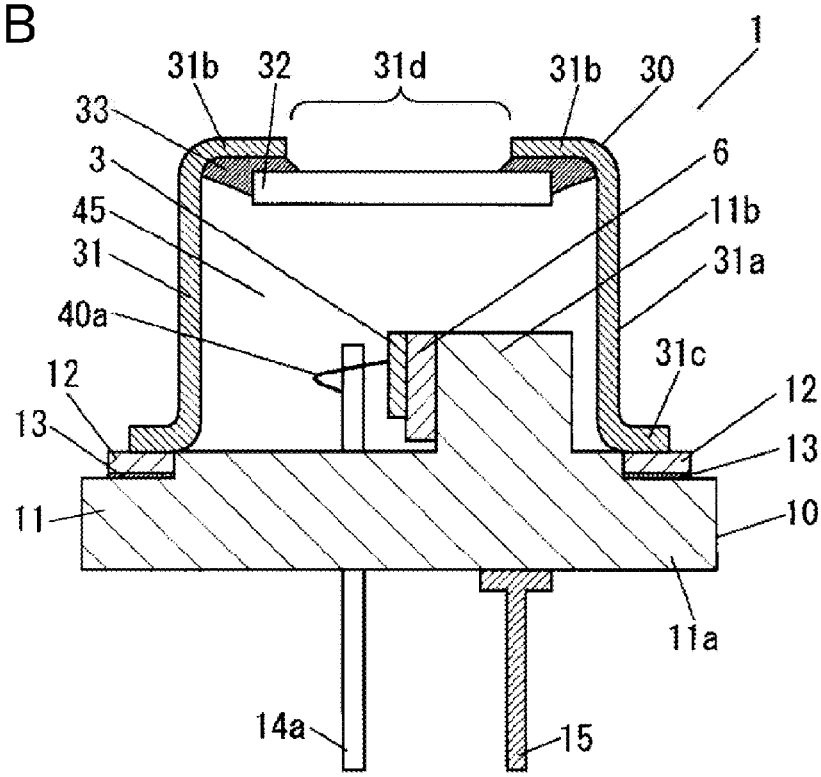
FIG. 2B is a cross-sectional view taken along the line IIb-IIb of the nitride semiconductor light-emitting system in FIG. 1A.
Figure 3:
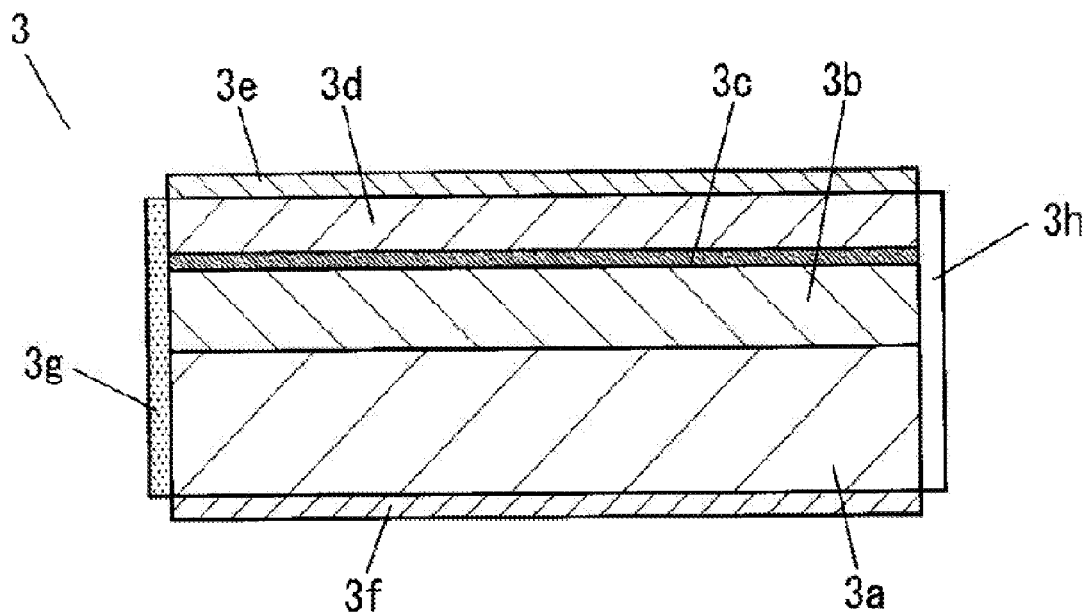
FIG. 3 is a cross-sectional view of a nitride semiconductor light-emitting device mounted in the nitride semiconductor light-emitting system according to the first embodiment.
Figure 4A:
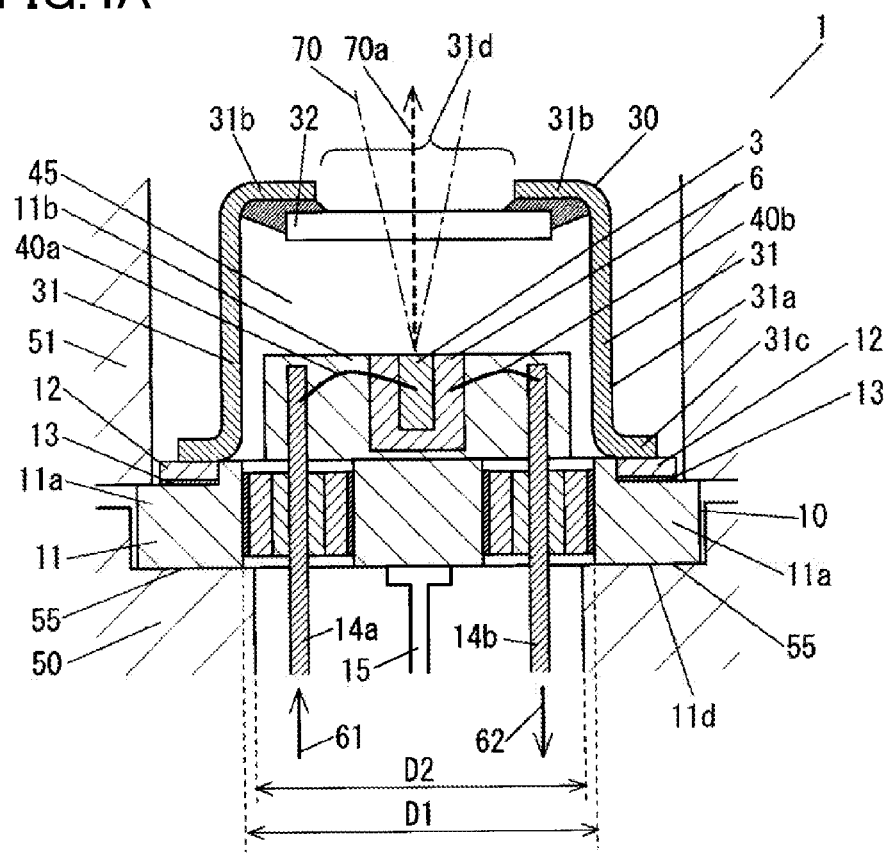
FIG. 4A illustrates the operation of the nitride semiconductor light-emitting system according to the first embodiment.
Figure 4B:
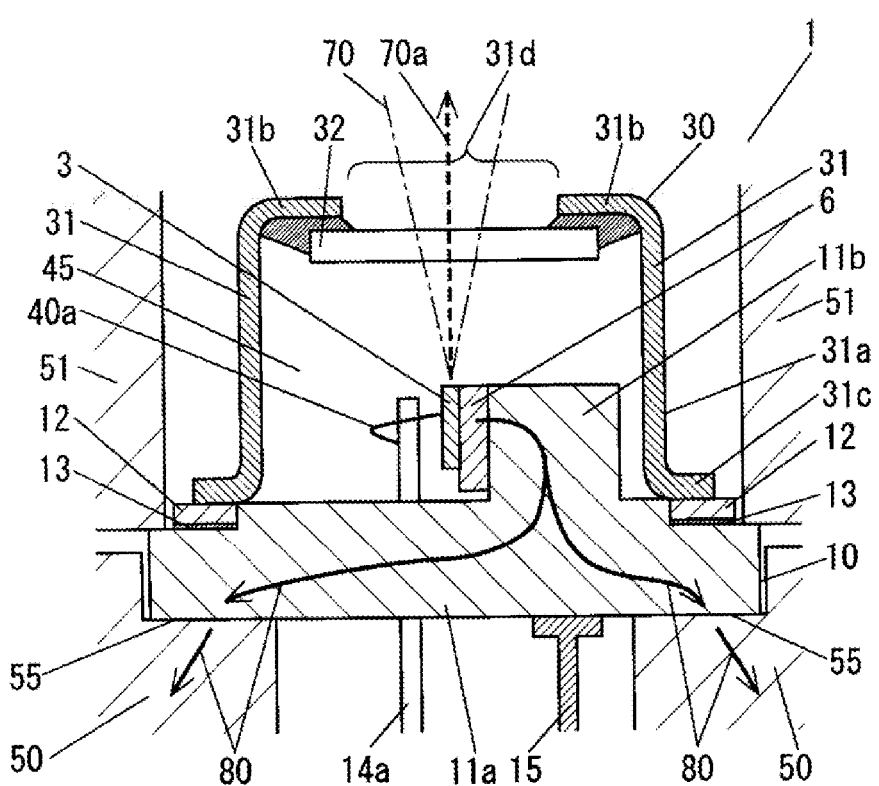
FIG. 4B illustrates the operation of the nitride semiconductor light-emitting system according to the first embodiment.

A nitride semiconductor light-emitting system according to a first embodiment will be described with reference to FIGS. 1A-8F. FIG. 1A is a perspective view of the nitride semiconductor light-emitting system according to this embodiment. FIG. 1B is an exploded perspective view. A cap 30 is detached from a package 10 to illustrate the structure of the nitride semiconductor light-emitting system according to this embodiment. FIGS. 2A and 2B are schematic cross-sectional views illustrating the structure of the nitride semiconductor light-emitting system according to this embodiment in detail. FIG. 2A is a cross-sectional view taken along the line IIa-IIa of FIG. 1A. FIG. 2B is a cross-sectional view taken along the line IIb-IIb of FIG. 1A. FIG. 3 is a schematic cross-sectional view of a nitride semiconductor light-emitting device mounted in the nitride semiconductor light-emitting system according to this embodiment. FIGS. 4A and 4B are schematic cross-sectional views illustrating the operation of the nitride semiconductor light-emitting system according to this embodiment. FIG. 5 is a list of materials used for packages of semiconductor light-emitting systems. FIGS. 6A-6C illustrate mechanisms of possible gas generation in the nitride semiconductor light-emitting system according to this embodiment. FIGS. 7A-7E include a table comparing thermal resistance between the nitride semiconductor light-emitting system according to this embodiment and nitride semiconductor light-emitting systems according to comparison examples, and example materials of the components of the nitride semiconductor light-emitting system according to this embodiment.

FIGS. 8A-8F illustrate a method of manufacturing the nitride semiconductor light-emitting system according to this embodiment.

First, the structure of the nitride semiconductor light-emitting system according to this embodiment will be described with reference to FIGS. 1A-3. As shown in FIG. 1A, a nitride semiconductor light-emitting system 1 according to this embodiment is of a package type what is called a CAN type. Specifically, in the nitride semiconductor light-emitting system 1, as shown in FIG. 1B, a nitride semiconductor light-emitting device 3 is adhered to a package 10 via a sub-mount 6, and then airtightly enclosed by the cap 30.

As a basic structure of the package 10, lead pins 14a and 14b are attached to a base mount 11, for example, made of oxygen-free copper, for electrical connection. Specifically, for example, the base mount 11 includes a disk-like base 11a, and a post 11b. The post 11b is connected to a principal surface 11e of the base 11a, which faces the nitride semiconductor light-emitting device 3 to fix the nitride semiconductor light-emitting device 3. The base 11a has openings 11c for fixing the lead pins which electrically connect the principal surface 11e to a fixed surface 11d at the opposite side. At this time, the base 11a and the post 11b are preferably made by the same high thermal conductivity material, and integrally formed. A specific material is, for example, a copper alloy such as oxygen-free copper, copper tungsten, and copper molybdenum, which contains copper as a main component. Each of the lead pins 14a and 14b penetrates the opening 11c to be fixed to the inner wall of the opening with a buffer member and an insulating member interposed therebetween, which are stacked on the lead pin in this order. Specifically, ring-like buffer members 20a and 20b made of, for example, Fe or an Fe alloy (e.g., steel, stainless steel, etc.) are adhered to the openings 11c by adhesive layers 19a and 19b, which are made of, for example, silver solder. The lead pins 14a and 14b are fixed to the insides of the buffer members 20a and 20b via ring-shaped insulating members 18a and 18b, which are made of soft glass formed by adding modified oxide to, for example, silicon oxide (i.e., $SiO_2$ or $SiO_x$). At this time, the insulating members 18a and 18b are separated from the base mount 11 (i.e., the base 11a) by the interposed buffer members 20a and 20b. Thus, the insulating members 18a and 18b, and the base mount 11 are fixed without direct contact. The surfaces of the buffer members 20a and 20b close to the fixed surface 11d are positioned one stage lower than the fixed surface 11d, in other words, inside the openings 11c. As will be described later, this aims to provide effective contact between the fixed surface 11d and external fixtures. A ground lead pin 15 is welded to the base 11a or fixed to the base 11a by silver solder. The ground lead pin 15 is electrically connected to the base 11a. A welding base 12 is fixed to the principal surface 11e of the base 11a by brazing with an adhesive layer 13 made of, for example, silver solder to surround the post 11b. The welding base 12 is made of a material such as an Fe—Ni alloy (e.g., a 42 alloy) or kovar, which is more resistive than the base 11a and suitable for resistance welding.

As shown in FIG. 2B, the nitride semiconductor light-emitting device 3 is adhered to the surface of the post 11b of the base mount 11 formed in this manner, which is perpendicular to the principal surface 11e, via the sub-mount 6 made of, for example, AlN ceramics. The nitride semiconductor light-emitting device 3 is, as shown in FIG. 3, formed by stacking a first nitride semiconductor layer 3b, a light-emitting layer 3c, and a second nitride semiconductor layer 3d on a substrate 3a by crystal growth. The substrate 3a is made of, for example, n-type GaN. The first nitride semiconductor layer 3b is a multilayer of, for example, an n-type buffer layer, an n-type cladding layer, and an n-type guide layer. The light-emitting layer 3c is a multiple quantum well of, for example, InGaN and GaN. The second nitride semiconductor layer 3d is a multilayer of, for example, a p-type guide layer and a p-type cladding layer. A first electrode 3e and a second electrode 3f, each of which is a metal multilayer made of, for example, any one of Pd, Pt, Ti, Ni, Al, W, or Au, are formed on the upper and lower surfaces of the nitride semiconductor light-emitting device 3. External electric power is applied to the light-emitting layer 3c via the first and second electrodes. A rear facet film 3g and a front facet film 3h, each of which is a dielectric multilayer, are formed on the end surfaces at the rear and the front of the nitride semiconductor light-emitting device 3. The dielectric multilayer includes a nitride film of, for example, AlN, BN, and SiN, and an oxide film of, for example, $SiO_2$, $Al_2O_3$, and $ZrO_2$, or an oxynitride film of AlON. In this configuration, light with a wavelength, for example, from 390 nm to 500 nm, which corresponds to the range from ultraviolet light to blue light, is irradiated from the front facet film 3h of the nitride semiconductor light-emitting device 3.

As shown in FIG. 2A, the cap 30 is formed by fixing a light-transmitting window 32 to a cylindrical metal cap 31 made of, for example, kovar, an Fe—Ni alloy (e.g., a 42 alloy), or iron, by an adhesive layer 33. Specifically, the metal cap 31 has a cylindrical portion 31a, window fixing portions 31b for fixing the light-transmitting window 32, and a light extraction opening 31d. On the other hand, flanges 31c, which are open outside and easily weldable to the base mount 11, are formed at the sides of the metal cap 31 close to the package 10. The light-transmitting window 32 is formed by stacking an antireflection film on the surface of an optical glass such as BK7. The adhesive layer 33 is made of, for example, soft glass. The nitride semiconductor light-emitting device 3 is enclosed by the cap 30 and the package 10. The atmosphere enclosed by the cap 30 and the package 10 contains gas containing oxygen such as sealed gas 45 which is mixed gas of oxygen and nitrogen.

Next, the operation of the nitride semiconductor light-emitting system according to this embodiment will be described below with reference to FIGS. 4A and 4B. When light is actually emitted within the nitride semiconductor light-emitting system 1, the base mount 11 is fixed to and in contact with a fixture 50 having an opening and made of, for example, a nigh thermal conductivity material such as an aluminum alloy and copper, and fixed and sandwiched by a presser 51. In order to avoid the contact between the fixture 50 and the lead pins 14a and 14b, the fixture 50 is in contact with the outer periphery of the fixed surface 11d of the base mount 11 only. At this time, the surfaces of the buffer members 20a and 20b close to the fixed surface 11d are positioned one stage lower than the fixed surface 11d, in other words, inside the openings 11c. Thus, the buffer members 20a and 20b do not hinder the contact between the fixture 50 and the base 11a. Therefore, the fixture 50 comes in tight contact with the base 11a on the fixed surface 11d. In addition, the inner diameter D2 of the opening of the fixture 50 is smaller than the inner diameter D1 of the opening of the base mount 11 with the buffer member. The side of the fixture 50 in contact with the fixed surface 11d covers part of the openings 11c. This maximizes the contact area, and improves the heat radiation capability from the base mount 11 to the fixture 50.

In the nitride semiconductor light-emitting system 1 arranged as above, electric power is supplied to the nitride semiconductor light-emitting device 3 from an external power source (not shown) through the lead pins 14a and 14b. The electric power applied to the nitride semiconductor light-emitting device 3 is converted to light with a wavelength, for example, ranging from 390 nm to 500 nm, which corresponds to the range from ultraviolet light to blue light, and then emitted outside the nitride semiconductor light-emitting device 3. The light emitted from the nitride semiconductor light-emitting device 3 is emitted light 70, which has a predetermined spread angle with respect to the axis (i.e., a main light beam 70a) extending from the nitride semiconductor light-emitting device 3 to the light-transmitting window 32. The emitted light 70 is transmitted by the light-transmitting window 32 and emitted outside the nitride semiconductor light-emitting system 1. On the other hand, when the electric power is converted to the light in the nitride semiconductor light-emitting device 3, part of the electric power is not converted to the light but to the Joule heat. The Joule heat generated in the nitride semiconductor light-emitting device 3 is transmitted to the sub-mount 6, and the post 11b and the base 11a of the base mount 11, and radiated outside the package as indicated by a heat radiation path 80 shown in FIG. 4B. At this time, since the fixed surface 11d of the base 11a is tightly attached to the fixture 50 by the presser 51, the Joule heat can be efficiently eradiated through a contact surface 55. This results in reduction in a temperature rise of the nitride semiconductor light-emitting device 3 caused by the generated Joule heat.

Figures 7B, 7C:
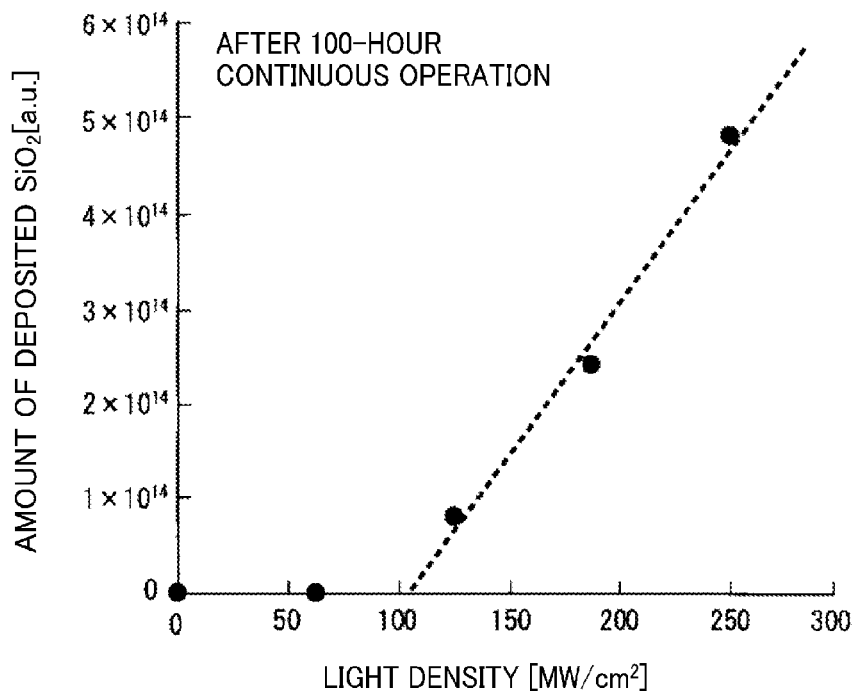
FIG. 7B illustrates the relation between the amount of deposited SiO$_2$ and light density in a nitride semiconductor light-emitting system according to a second comparison example.
FIG. 7C illustrates example materials of the components of the nitride semiconductor light-emitting system according to the first embodiment.

Then, in order to verify the advantages of this embodiment, a result of comparison between this embodiment and comparison examples will be described. FIG. 5 is a table of the characteristics such as thermal conductivity of pure metal used for considering the material of the package 10 according to this embodiment. FIG. 7A illustrates the materials of the package 10 according to this embodiment, and the materials considered as the comparison examples. The materials of the base mount 11 of the semiconductor light-emitting system according to a first comparison example may be steel for the base, and oxygen-free copper for the post. In a second comparison example, the base and the post are both made of oxygen-free copper as a high thermal conductivity material. In the structure of the second comparison example, no buffer member is interposed between the lead pins and the base, and thus the oxygen-free copper of the base comes in direct contact with the insulating member containing silicon oxide ($SiO_2$ or $SiO_x$). The present inventors found that, in the second comparison example, when the nitride semiconductor light-emitting device 3 operates to irradiate extremely high density light from the front facet film, a large amount of $SiO_2$ is deposited in the light-emitting section during long time drive to rapidly deteriorate the characteristics of the nitride semiconductor light-emitting device 3. As shown in FIG. 7B, the $SiO_2$ deposits appeared significantly when the light-emitting section has a light density of 100 MW/cm$^2$ or greater. By contrast, in this embodiment, such rapid deterioration did not occur. In the second comparison example, the mechanism of this rapid deterioration is not clear, but according to the study of the present inventors, one possible mechanism is as follows.

Specifically, in the second comparison example, the insulating member around the lead pin is in direct contact with the oxygen-free copper of the base. Thus, first, reduction reaction of silicon dioxide (e.g., $SiO_2$ in this example) shown in FIG. 6A generates a small amount of gas silicon oxide (SiO), part of which floats as part of the sealed gas 45. As shown in FIG. 6B, the part of SiO reacts with any of carbon (C), water ($H_2O$), or an organic, which is present in a small amount in the package to float as Si organic compound gas (SiO—R). On the other hand, during the operation of the nitride semiconductor light-emitting device 3, since high density light is irradiated from the front facet film, optical tweezers concentrate SiO and SiO—R to the front facet film with a higher light density, and allows to react with $O_2$ to deposit $SiO_2$ as shown in FIG. 6C. In order to reduce the reaction shown in FIG. 6C, mixing no oxygen as the sealed gas is considered. In this case, however, since the oxygen of the rear facet film 3g and the front facet film 3h of the nitride semiconductor light-emitting device is desorbed to deteriorate the characteristics of the nitride semiconductor light-emitting device 3, that is, the other phenomenon causes the deterioration. Therefore, the sealed gas 45 preferably contains oxygen. In the case where no oxygen is mixed intentionally, oxygen naturally mixed into the sealed gas 45 may cause a similar phenomenon. By contrast, in this embodiment, an iron alloy (e.g., steel, etc.) having a higher ionization tendency than the base material is in contact with the insulating members 18a and 18b. Metal or an alloy containing the metal with this high ionization tendency forms a stable oxide film on the surface so that silicon oxide (e.g., $SiO_2$ or $SiO_x$) forming the insulating member is not direct contact with the metal of the buffer member having reducing power. Thus, such a buffer member is interposed between the base and the insulating member, thereby reducing the reaction shown in FIG. 6A to reduce deterioration in the characteristics of the nitride semiconductor light-emitting device 3. The ionization tendency is expressed by a standard oxidation-reduction potential. A high ionization tendency material is a material with a small standard oxidation-reduction potential. That is, it is considered that the buffer member is made of metal having a small standard oxidation-reduction potential than metal, which is the main component of the base, or an alloy containing the metal, thereby reducing deterioration in the characteristics of the nitride semiconductor light-emitting device. As support for this mechanism, Japanese Unexamined Patent Publication No. 2004-289010 teaches that Si organic compound gas in a CAN package deteriorates the characteristics of a semiconductor light-emitting device. This document, however teaches that such Si organic compound gas is generated by an organic adhesive agent used for the package.

FIG. 7A illustrates the comparison of the measured thermal resistance between the material of this embodiment and the materials of the comparison examples. As shown in FIG. 7A, thermal resistance of the nitride semiconductor light-emitting system according to this embodiment is almost equal to that of the second comparison example where the base and the post are both made of oxygen-free copper. This efficiently radiates the Joule heat generated in the nitride semiconductor light-emitting device 3 of the nitride semiconductor light-emitting system 1, and reduces deterioration in the characteristics of the nitride semiconductor light-emitting device 3. By contrast, while the first comparison example was not subject to rapid deterioration as in the second comparison example, the deterioration progressed more rapidly than in this embodiment. This may be because the steel used for the base has low thermal conductivity and high thermal resistance. By contrast, in the nitride semiconductor light-emitting system according to this embodiment, the deterioration progressed more slowly than in the first comparison example. In addition, even when the light-emitting section of the nitride semiconductor light-emitting device 3 has a light density of 100 $MW/cm^2$ or greater, the characteristics did not rapidly deteriorate and the life time improved by one digit. As a result, the present inventors found that this embodiment reduces deterioration in the characteristics of the nitride semiconductor light-emitting device 3, and efficiently radiates the Joule heat generated in the nitride semiconductor light-emitting device 3 at a high level, and that the embodiment provides these advantages significantly when the semiconductor light-emitting device has a high light density.

FIGS. 7C-7E illustrate combinations of the materials of the package components, which provide advantages similar to those in this embodiment shown in FIG. 7A. While FIG. 5 illustrates the materials having surfaces on which an oxide film is easily formed as pure metal, indeed, alloys are often used as the materials of the components. However, the characteristics of the alloys are influenced by the characteristics of the pure metal forming the alloys, and thus the materials can be decided based on the characteristics shown in FIG. 5.

FIG. 7C illustrates first example materials of the package components. In this case, the package is of a compression sealed type, and the insulating member is made of soft glass. As the material of the buffer member, metal having a smaller standard oxidation-reduction potential than the metal which is the main component of the base, or an alloy containing the metal is selected. In the example materials, the base contains Cu as the main component, the buffer member may be made of metal having a smaller standard oxidation-reduction potential than Cu based on FIG. 5. Although the exact values are unknown, molybdenum (Mo) and tungsten (W) have a smaller standard oxidation-reduction potential than Cu. As described above, where the base contains Cu as the main component, the buffer member is preferably made of any one metal of Fe, Ni, Co, Cr, Ti, Al, Mg, Mo, or W, or an alloy containing any of the metal. In order to improve the airtightness of the package, the buffer member is preferably made of an aluminum alloy, a magnesium alloy, or steel, stainless steel, nickel, titanium, or an alloy containing the materials, which has a thermal expansion coefficient equal to or greater than soft glass. More preferably, the lead pin is made of an Fe—Ni alloy, kovar, or the like, which has a thermal expansion coefficient equal to or smaller than soft glass. More preferably, the material of the base has a greater thermal expansion coefficient than the material of the buffer member.

FIG. 7D illustrates second example materials where the insulating member is made of hard glass. In this case as well, the components preferably have the relation of thermal expansion coefficients similar to those in the first example materials. While copper molybdenum and copper tungsten are listed, molybdenum and tungsten are mixed to copper to easily form an oxide film on the surface, thereby reducing the deterioration in the characteristics of the nitride semiconductor light-emitting device.

FIG. 7E illustrates third example materials where the package is formed by matching sealing. In this case, while thermal expansion coefficients of the lead pin, the insulating member, and the buffer member need to be equal, the buffer member may be made of molybdenum or tungsten, which has a relatively small thermal expansion coefficient. The preferable relation between the thermal expansion coefficients of the buffer member and the base is similar to those of the first and second example materials.

In the first to third example materials, while the base is made of oxygen-free copper, the material is not limited thereto. The material of the base preferably has lower ionization tendency (a greater standard oxidation-reduction potential) than the material of the buffer member, and particularly high thermal conductivity. Other than copper, silver (Ag), platinum (Pt), and gold (Au) may be used. Not limited to pure metal, an alloy may be used, as long as it contains a material having lower ionization tendency than the material of the buffer member as the main component.

Figure 8A:
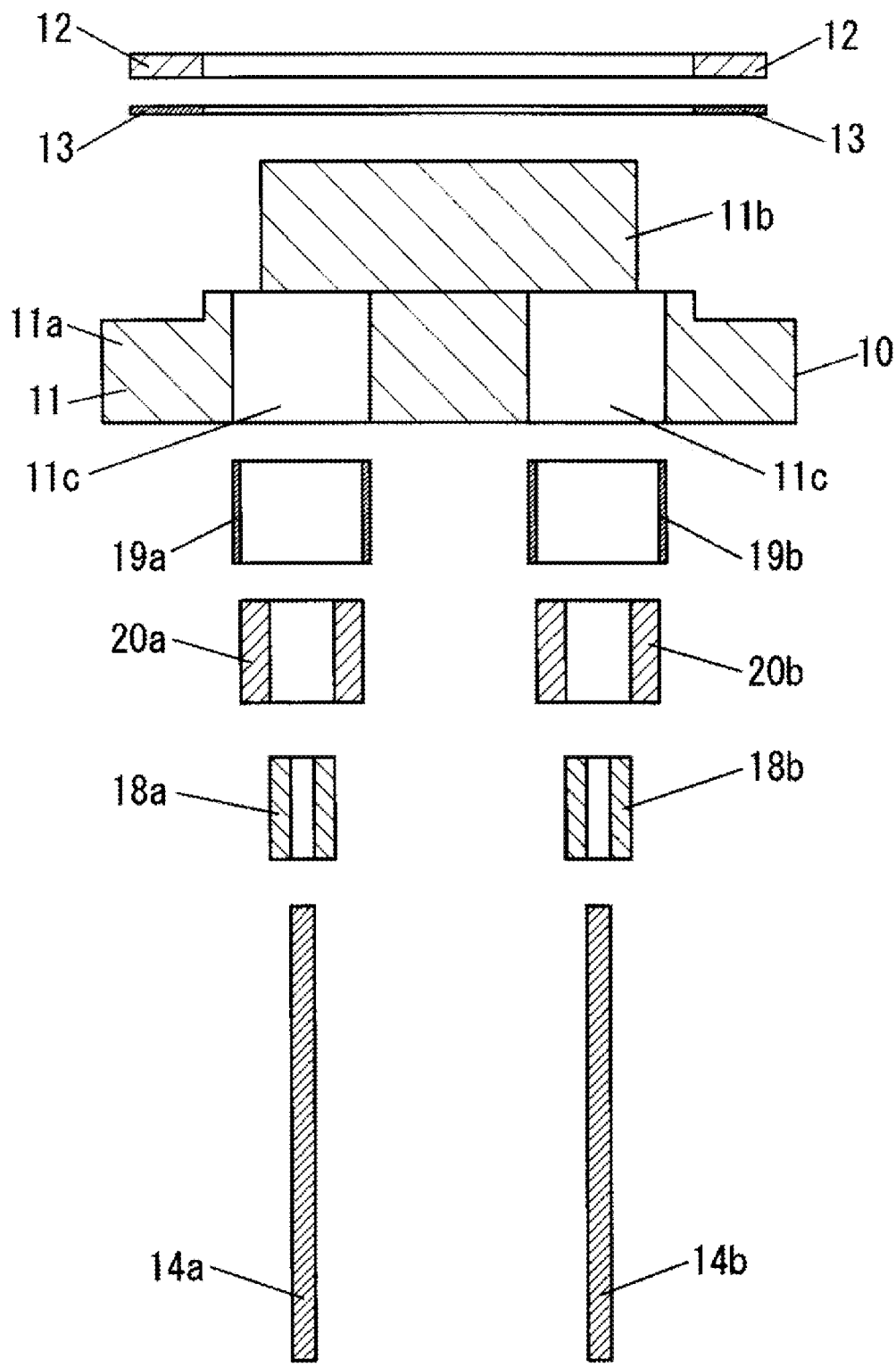
FIG. 8A illustrates a method of manufacturing of the nitride semiconductor light-emitting system according to the first embodiment.
Figure 8B:
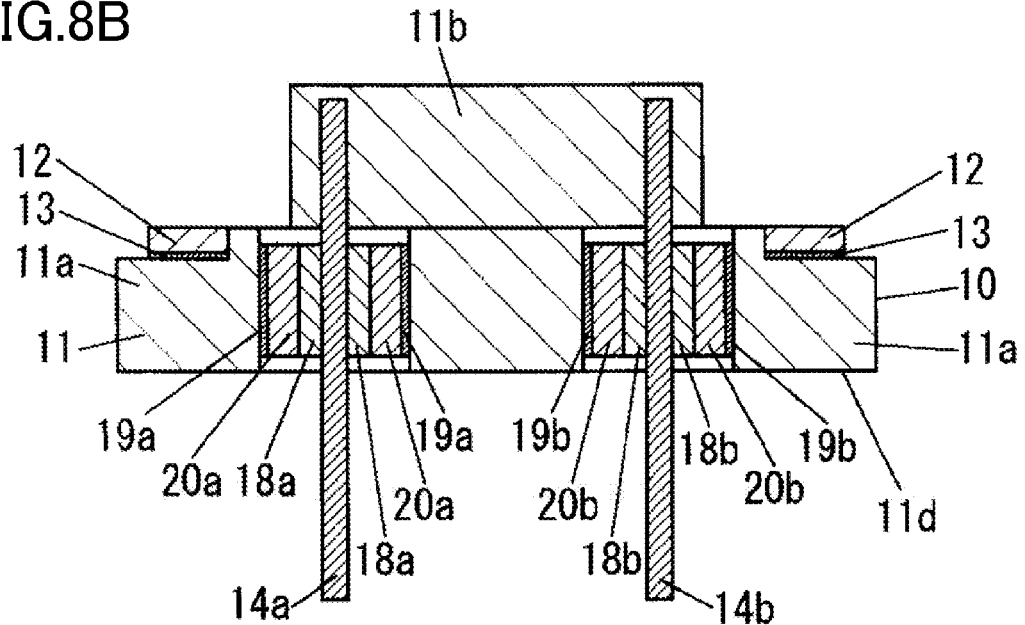
FIG. 8B illustrates the method of manufacturing of the nitride semiconductor light-emitting system according to the first embodiment.

A method of manufacturing the nitride semiconductor light-emitting system according to this embodiment will be described below with reference to FIGS. 8A-8F. FIG. 8A is an exploded view of the materials of the package 10 used in the nitride semiconductor light-emitting system 1 according to this embodiment. First, the base 11a and the post 11b are integrally molded using, for example, the mold having the form of the base 11a, the post 11b, and the openings 11c of the base mount 11, and oxygen-free copper (OFCU). Then, after being fabricated, the ring-shaped welding base 12 is fixed to the principal surface 11e of the base mount 11 using the adhesive layer 13 made of, for example, silver solder. At this time, simultaneously or continuously, the lead pins 14a and 14b made of, for example, an FeNi alloy, the ring-shaped insulating members 18a and 18b made of, for example, soft glass, the buffer members 20a and 20b made of, for example, iron or an iron alloy, and the adhesive layers 19a and 19b being, for example, a ring-shaped silver solder are fixed to the openings 11c from the center to the outside using a predetermined jig, and then heated, thereby fixedly adhering the lead pins 14a and 14b to the openings 11c. After that, as shown in FIG. 8B, the ground lead pin 15 is adhered to the fixed surface 11d of the base 11a, for example, by resistance welding.

Figure 8C:
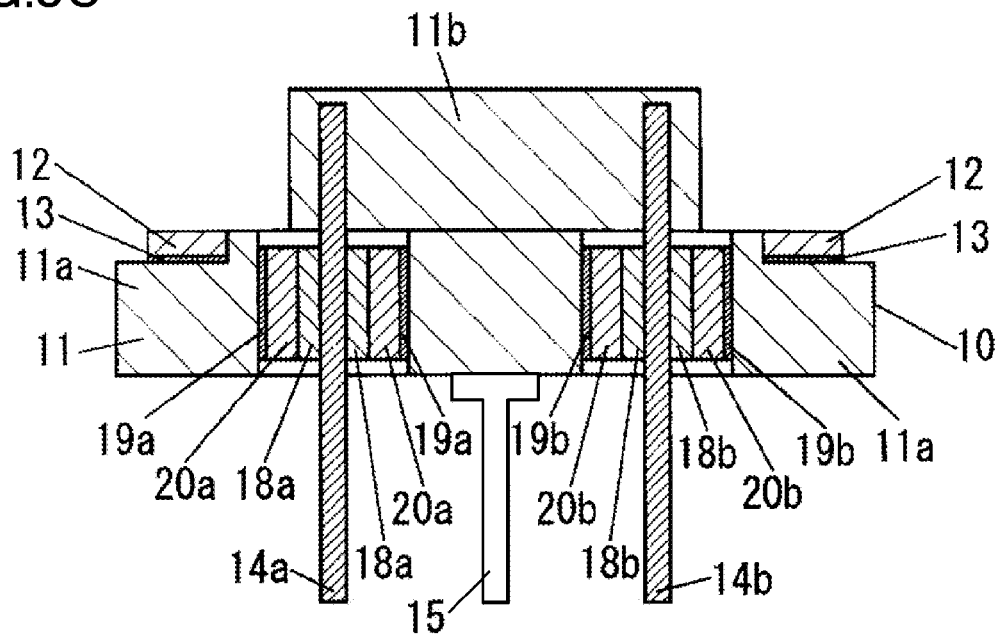
FIG. 8C illustrates the method of manufacturing of the nitride semiconductor light-emitting system according to the first embodiment.

Then, as shown in FIG. 8C, although not shown, the package 10 is plated with, for example, Ni and Au to reduce oxidation of the surface.

Figure 8D:
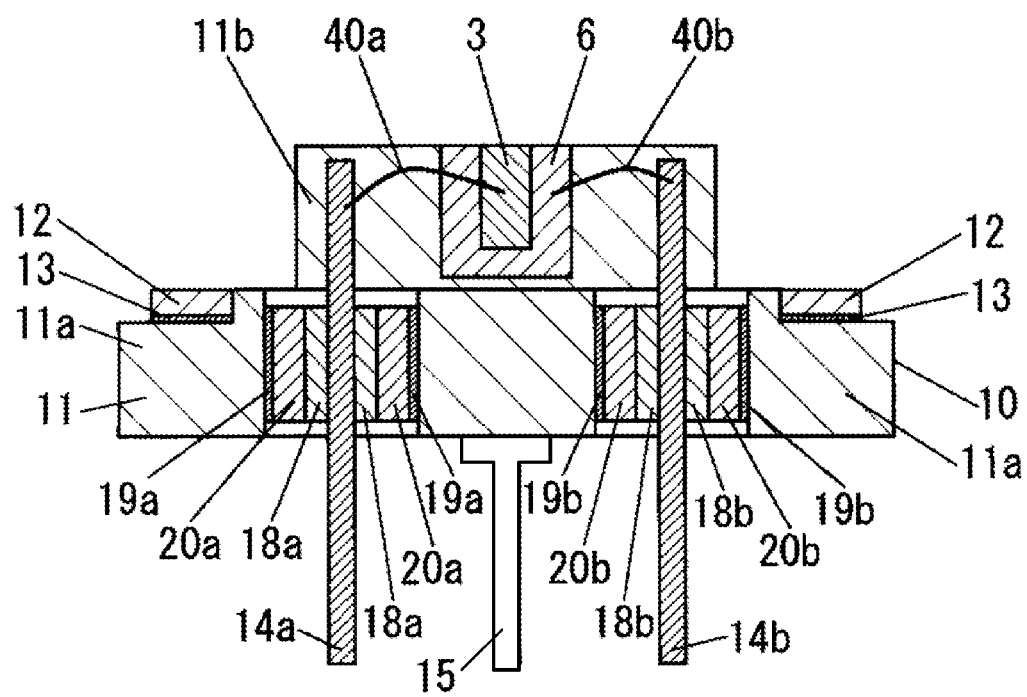
FIG. 8D illustrates the method of manufacturing of the nitride semiconductor light-emitting system according to the first embodiment.

Next, as shown in FIG. 8D, the nitride semiconductor light-emitting device 3 is mounted on the post 11b of the package 10 via the sub-mount 6. After that, wires 40a and 40b are attached to electrically connect the nitride semiconductor light-emitting device 3 to the lead pins 14a and 14b.

Figure 8E:
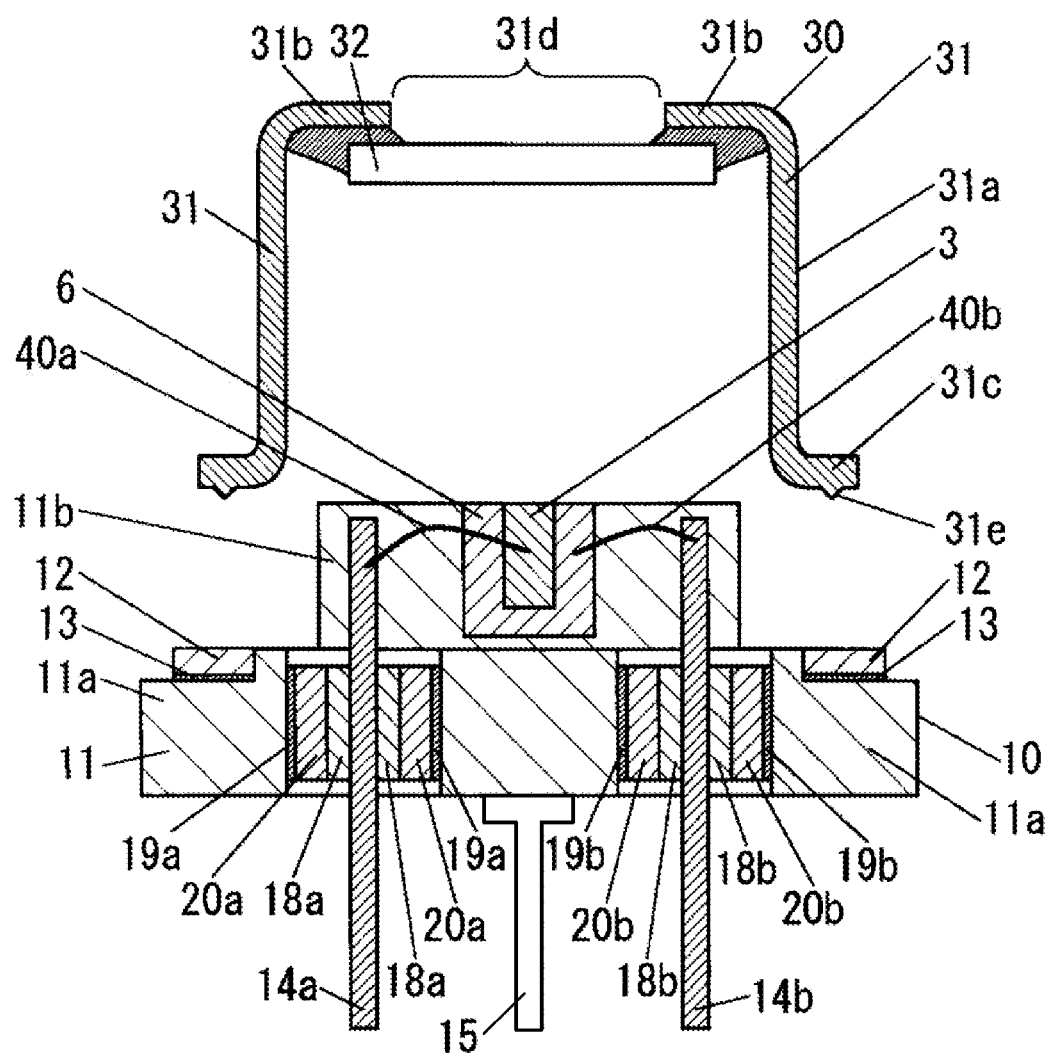
FIG. 8E illustrates the method of manufacturing of the nitride semiconductor light-emitting system according to the first embodiment.

Then, as shown in FIG. 8E, the cap 30 is disposed above the package 10. At this time, the cap 30 is fabricated by the following manufacturing method. First, a material such as kovar having a thermal expansion coefficient close to that of glass is used to form the light extraction opening 31d and the flanges 31c in the tubular metal cap 31 by pressing. At the same time, a protrusion 31e for welding is formed in each of the flanges 31c. Next, the light-transmitting window 32 is fixed to the light extraction opening 31d by the adhesive layer 33 made of, for example, low-melting glass. The light-transmitting window 32 is made of, for example, glass, and has, on its surface, an antireflection film less reflective of the light irradiated from the nitride semiconductor light-emitting device 3.

Figure 8F:
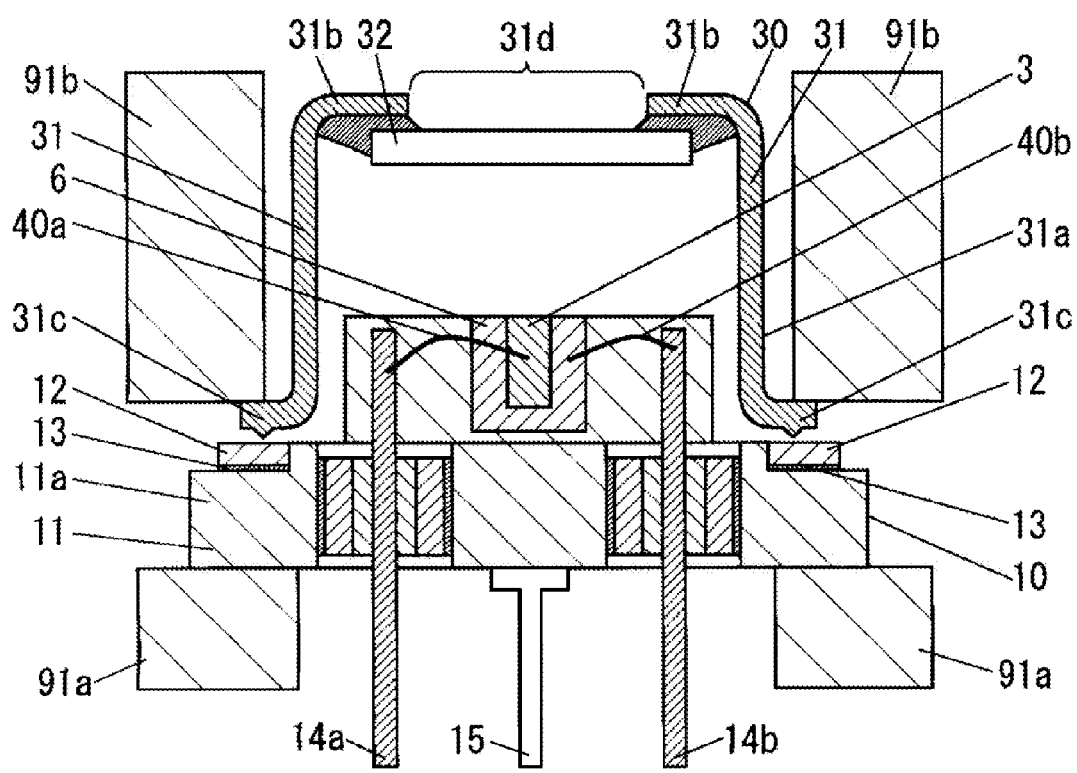
FIG. 8F illustrates the method of manufacturing of the nitride semiconductor light-emitting system according to the first embodiment.

After that, as shown in FIG. 8F, the package 10 and the cap 30 are fixed using fixing bases 91a and a presser 91b, and a predetermined current flows to weld the welding base 12 and the cap 30 using the protrusions 31e.

With the above-described method, the nitride semiconductor light-emitting system according to this embodiment is easily manufactured.

Second Embodiment

Figure 9A:
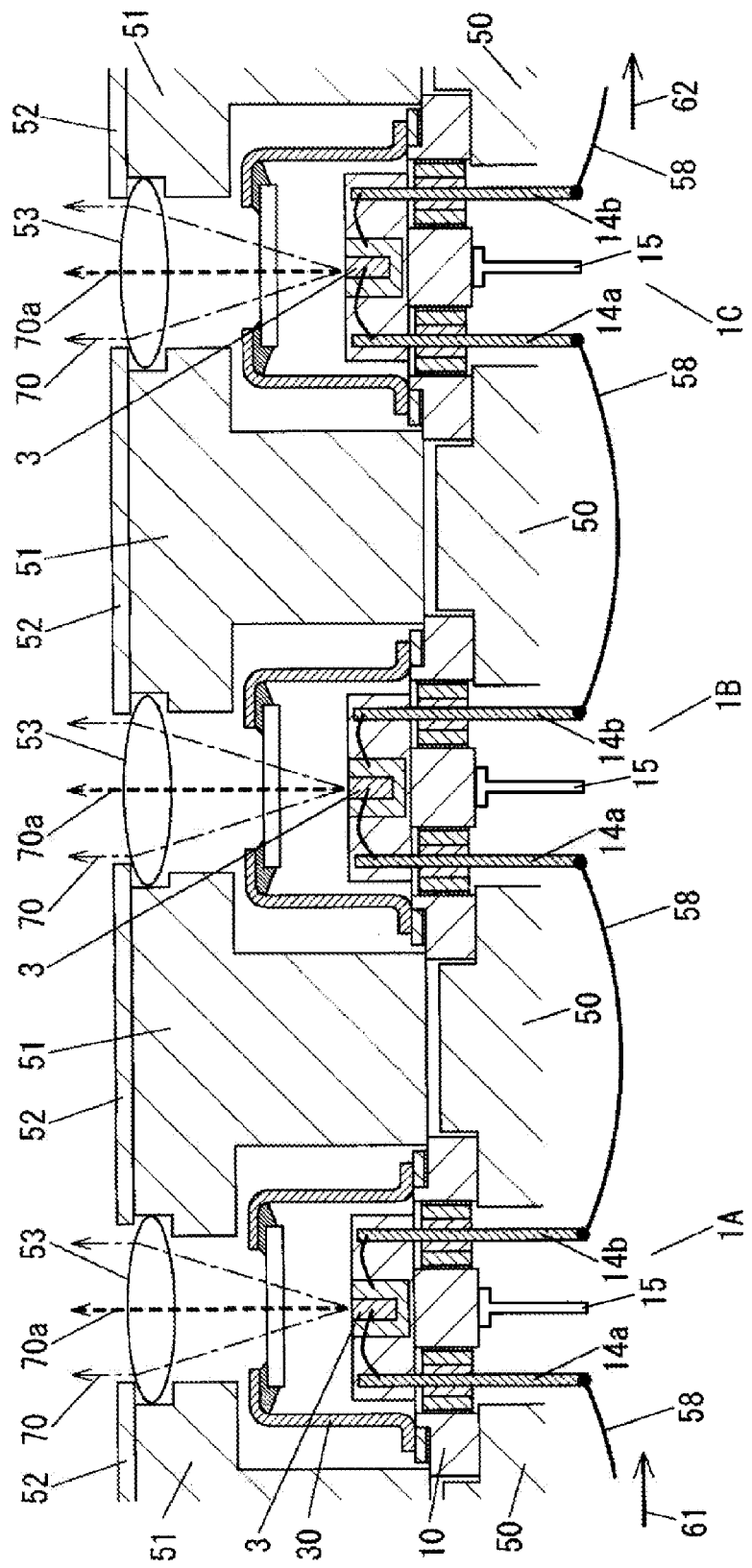
FIG. 9A is a cross-sectional view of a nitride semiconductor light-emitting system according to a second embodiment.
Figure 9B:
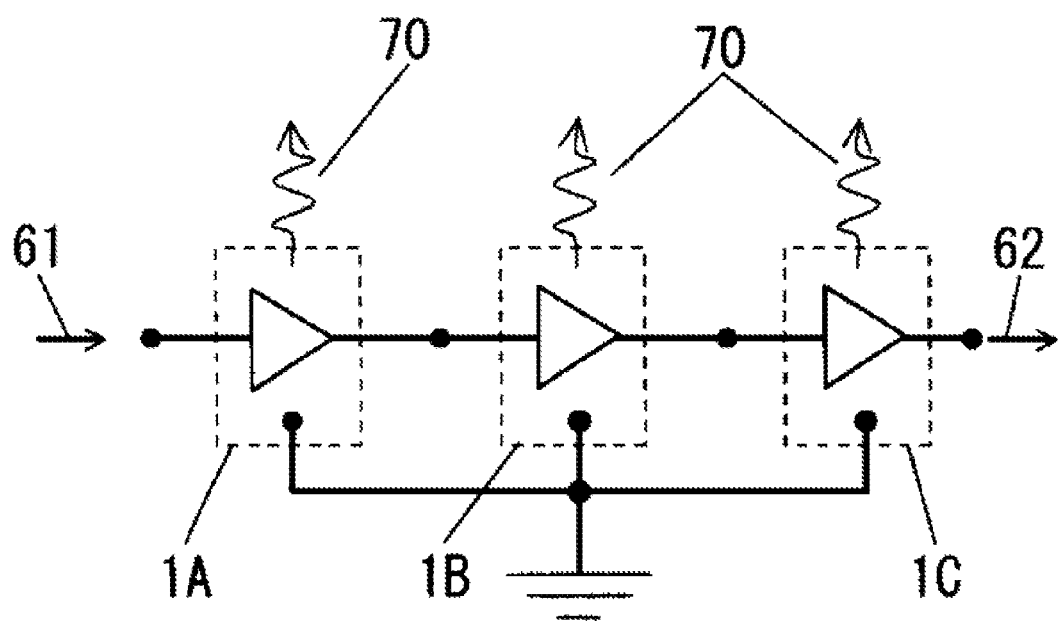
FIG. 9B illustrates an equivalent circuit of the nitride semiconductor light-emitting system according to the second embodiment.

A nitride semiconductor light-emitting system according to a second embodiment will be described below with reference to FIGS. 9A and 9B. FIG. 9A is a cross-sectional view illustrating the structure of the nitride semiconductor light-emitting system according to the second embodiment. FIG. 9B illustrates an equivalent circuit of the nitride semiconductor light-emitting system according to the second embodiment. The same reference characters as those in the first embodiment are used to represent equivalent elements, and the explanation thereof will be omitted.

First, FIG. 9A illustrates three nitride semiconductor light-emitting systems 1A, 1B, and 1C according to the second embodiment, fixtures 50 for fixing the systems, pressers 51, collimator lenses 53, lens pressers 52, and electric wires 58.

In this embodiment, as shown in FIG. 9B, the nitride semiconductor light-emitting systems 1A, 1B, and 1C are connected in series by the electric wires 58. At this time, in each of the nitride semiconductor light-emitting systems according to this embodiment, the anode and the cathode of a nitride semiconductor light-emitting device 3 are electrically separated from a base mount 11 and the systems are thus easily connected in series. In particular, a fixed surface 11d of the base mount 11 is electrically separated from the nitride semiconductor light-emitting device 3 so that the base mount 11 comes in contact with the fixture 50 with no insulating layer interposed therebetween. Thus, heat generated in the nitride semiconductor light-emitting systems is easily eradiated outside via the fixtures 50. Light 70 emitted from the nitride semiconductor light-emitting systems 1A, 1B, and 1C is irradiated as parallel light by the collimating lens 53.

Third Embodiment

Figure 10:
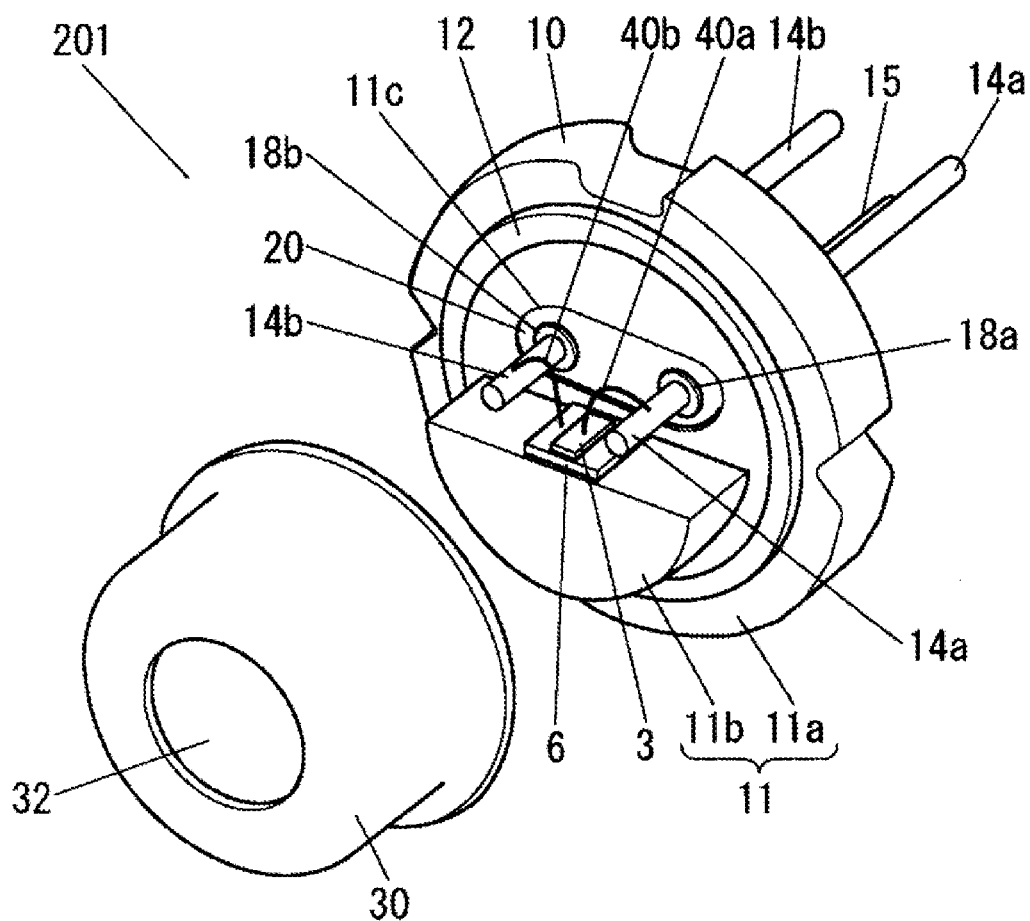
FIG. 10 is an exploded perspective view of a nitride semiconductor light-emitting system according to a third embodiment.
Figure 11:
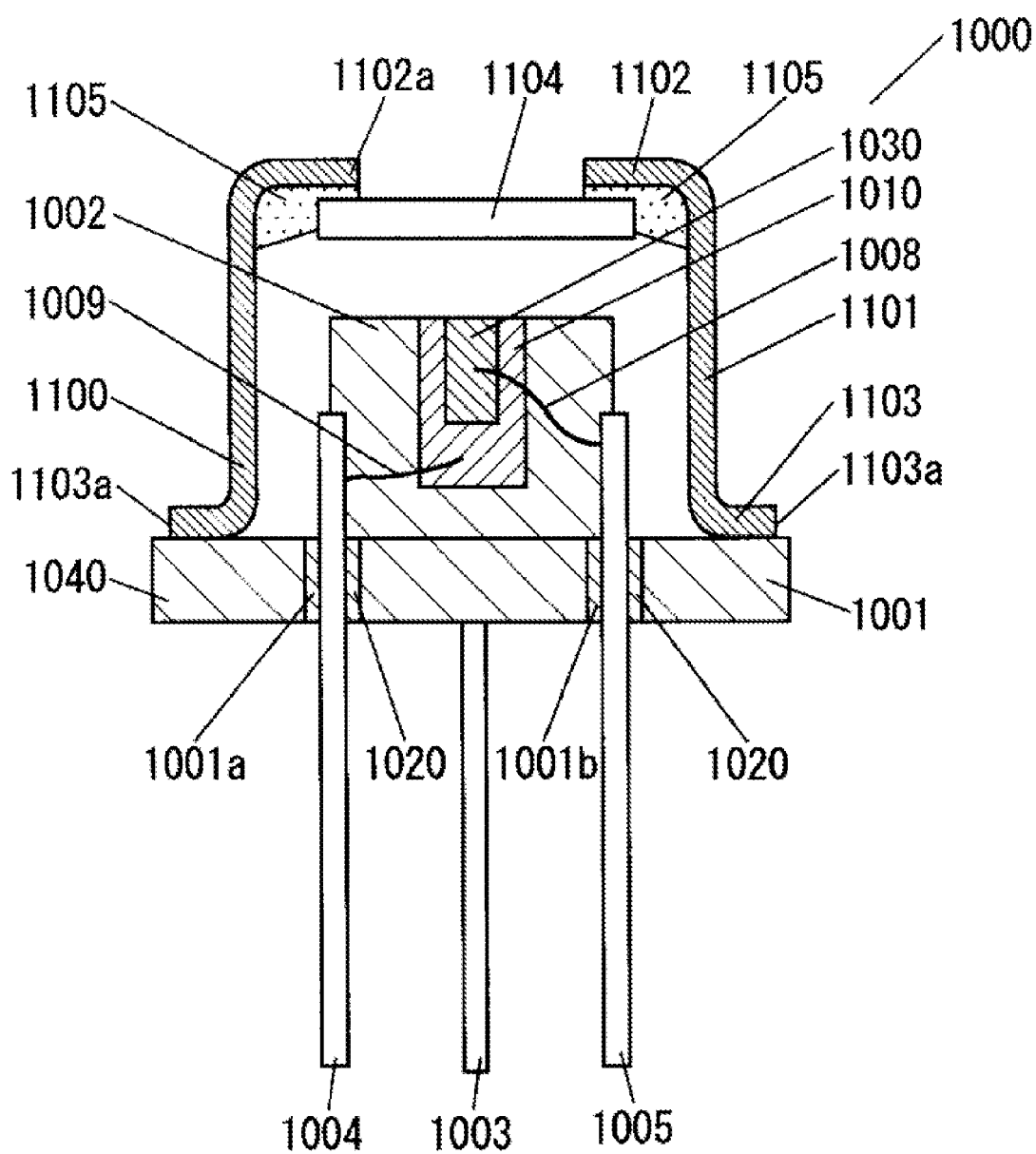
FIG. 11 illustrates the structure of a conventional semiconductor light-emitting system.
Figure 12:
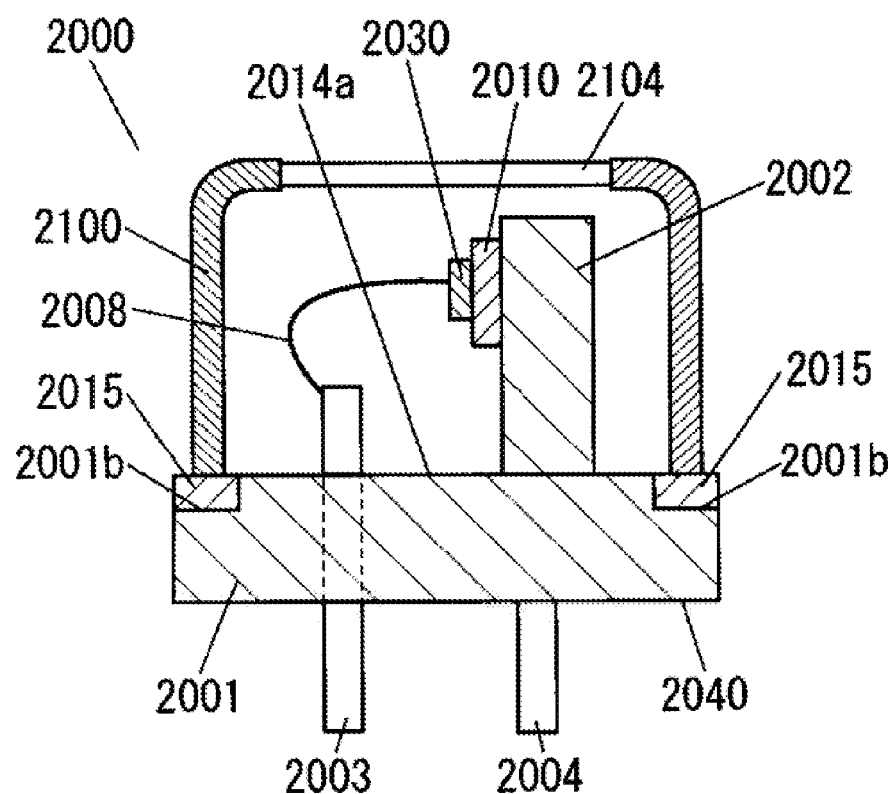
FIG. 12 illustrates the structure of another conventional semiconductor light-emitting system.

A nitride semiconductor light-emitting system 201 according to a third embodiment will be described below with reference to FIG. 10. FIG. 10 is an exploded perspective view illustrating that a cap 30 is detached from a package 10 in the nitride semiconductor light-emitting system according to the third embodiment. The same reference characters as those in the first embodiment are used to represent equivalent elements, and the explanation thereof will be omitted. The nitride semiconductor light-emitting system 201 has a greatly different number and shape of buffer members from the nitride semiconductor light-emitting system 1 according to the first embodiment. In the first embodiment, each of the plurality of lead pins has the ring-shaped buffer member. In this embodiment, a plurality of lead pins share a common buffer member. Specifically, a base 11a has a common opening 11c shared by the plurality of lead pins. A buffer member 20, which has a plurality of openings for fixing the plurality of lead pins, is adhered to the opening 11c. The plurality of lead pins 14a and 14b are fixed to the insides of the openings of the buffer member 20 via ring-shaped insulating members 18a and 18b. With this structure, similar to the first embodiment, the insulating members 18a and 18b are separated from a base mount 11 (i.e., the base 11a) via the buffer members interposed therebetween to be fixed but not in direct contact with the base mount 11 (i.e., the base 11a). This structure reduces the number of the components of the package 10, thereby providing the nitride semiconductor light-emitting system at low costs.

While in the first to third embodiments, two lead pins and one ground lead pin are used in the package, the numbers are not limited thereto. For example, when the base is fixed to an external fixture for grounding, no ground lead is required. The nitride semiconductor light-emitting device mounted in the nitride semiconductor light-emitting system may be an array device with a plurality of waveguides and three or more lead pins connected to the waveguides via wires. In this case, the buffer member ring is used for each of the plurality of lead pins, thereby effectively reducing deterioration in the characteristics of the nitride semiconductor light-emitting devices.

In the first to third embodiments, each of the nitride semiconductor light-emitting devices is the nitride semiconductor-based semiconductor laser or the nitride semiconductor-based semiconductor laser array, which has a light-emitting wavelength ranging, for example, from 380 nm to 500 nm, and an optical output of 1 watt or greater. The devices may be other nitride semiconductor light-emitting devices, for example, nitride semiconductor-based superluminescent diodes with low speckle noise suitable for image display devices.

The semiconductor light-emitting system and the light source according to the present disclosure are useful as light sources of image display devices such as laser displays and projectors, and laser devices for industrial use such as laser processing and laser annealing, which require a relatively great optical output.

What is claimed is:

1. A nitride semiconductor light-emitting system comprising:
a nitride semiconductor light-emitting device;
a base mount holding the nitride semiconductor light-emitting device, having an opening, and containing first metal as a main component;
a cap adhered to the base mount; and
a lead pin penetrating the opening, wherein:
the lead pin is fixed to an inner wall of the opening with an insulating member and a buffer member interposed therebetween, the buffer member and the insulating member being stacked on the inner wall in this order,
the base mount includes a base having the opening, and a post connected to the base,
the base has a principal surface facing the nitride semiconductor light-emitting device, and a fixed surface opposite to the principal surface, and
a bottom surface of the buffer member close to the fixed surface is recessed from the fixed surface of the base such that the bottom surface of the buffer member does not extend to the fixed surface of the base.

2. The device of claim 1, wherein the base mount contains Cu as a main component.

3. The device of claim 2, wherein the buffer member is made of any one metal of Fe, Ni, Co, Cr, Ti, Al, Mg, Mo, or W, or an alloy containing any of the metal.

4. The device of claim 3, wherein the buffer member is made of Fe or an Fe alloy.

5. The device of claim 1, wherein a thermal expansion coefficient of the buffer member is equal to or greater than a thermal expansion coefficient of the insulating member.

6. The device of claim 5, wherein a thermal expansion coefficient of the lead pin is equal to or smaller than the thermal expansion coefficient of the insulating member.

7. The device of claim 5, wherein a thermal expansion coefficient of the base mount is equal to or greater than the thermal expansion coefficient of the buffer member.

8. The device of claim 1, wherein an atmosphere enclosed by the base mount and the cap contains oxygen.

9. The device of claim 1, wherein light emitted from the nitride semiconductor light-emitting device has a density of 100 MW/cm$^2$ or greater.

10. The device of claim 1, further comprising:
a fixture holding the base, wherein
the fixture covers part of the opening.

11. The device of claim 1, further comprising:
a plurality of lead pins, wherein
the opening and the buffer member are provided for each of the plurality of lead pins.

12. The device of claim 1, further comprising:
a plurality of lead pins, wherein
the opening and the buffer member are shared by the plurality of lead pins, and
the buffer member has a plurality of openings penetrated by the plurality of lead pins.

13. The device of claim 1, wherein:
the insulating member contains silicon oxide as a component, and
the buffer member is made of second metal having a smaller standard oxidation-reduction potential than the first metal, or an alloy containing the second metal.

14. The device of claim 1, wherein:
the post has a device fixing surface perpendicular to the principal surface of the base, and
each of the base and the post contains Cu as a main component.

15. The device of claim 1, wherein the bottom surface of the buffer member is not flush with the fixed surface of the base.

* * * * *